US005598343A

United States Patent [19]
Roy et al.

[11] Patent Number: 5,598,343
[45] Date of Patent: Jan. 28, 1997

[54] METHOD OF SEGMENTING AN FPGA CHANNEL ARCHITECTURE FOR MAXIMUM ROUTABILITY AND PERFORMANCE

[75] Inventors: Kaushik Roy, West Lafayette, Ind.; Sudip K. Nag, Pittsburgh, Pa.

[73] Assignee: Texas Instruments Incorporated, Dallas, Tex.

[21] Appl. No.: 130,605

[22] Filed: Oct. 1, 1993

[51] Int. Cl.$^6$ .................. H03K 19/177; H03K 17/693
[52] U.S. Cl. .................. 364/489; 326/39; 326/41; 340/825.83
[58] Field of Search ............... 364/488, 489, 364/490, 491, 716; 340/825.83; 326/39, 41

[56] References Cited

U.S. PATENT DOCUMENTS

| | | | |
|---|---|---|---|
| 5,073,729 | 12/1991 | Greene et al. | 307/465.1 |
| 5,202,840 | 4/1993 | Wong | 364/490 |
| 5,222,031 | 6/1993 | Kaida | 364/491 |
| 5,224,056 | 6/1993 | Chene et al. | 364/490 |
| 5,260,881 | 11/1993 | Agrawal et al. | 364/489 |
| 5,267,176 | 11/1993 | Antreich et al. | 364/491 |
| 5,309,372 | 5/1994 | Marui et al. | 364/491 |
| 5,349,248 | 9/1994 | Parlour et al. | 307/465 |

OTHER PUBLICATIONS

"Partitioning and Placement Technique for CMOS Gate Arrays" by Odawara et al., IEEE Trans. on Computer–Aided Design of Integrated Circuits and Systems, CAD 6, No. 3, May 1987, pp. 355–363.

"Placement by Simulated Annealing on a Multiprocessor" by Kravitz et al., IEEE Trans. on Computer–Aided Design of Integrated Circuits and Systems, CAD 6, No. 4, Jul. 1987, pp. 534–549.

*Primary Examiner*—Vincent N. Trans
*Attorney, Agent, or Firm*—W. James Brady, III; Richard L. Donaldson

[57] ABSTRACT

The current invention considers automatic synthesis of segmented channel architecture of row-based FPGAs so as to achieve maximum routability and performance. The routability of a channel and the performance of the routed nets may have conflicting requirements. For a given number of tracks, very short segments usually enhance routability at the expense of performance. For such a granular segmented channel architecture routing of long nets may require that several short segments be joined together by programming horizontal antifuses. Depending on the antifuse technology, the programmed antifuses can add considerably to the path delays. A simulated annealing based channel architecture synthesis algorithm has been developed which enhances routability and performance. The synthesis algorithm is based on the fact that a strong correlation between the spatial distribution of nets and segments in a channel improves both routability and performance.

1 Claim, 3 Drawing Sheets

METHOD OF SEGMENTING AN FPGA CHANNEL ARCHITECTURE FOR MAXIMUM ROUTABILITY AND PERFORMANCE

BACKGROUND OF THE INVENTION

1. Field of the Invention

This invention relates to the automatic synthesis of a segmented channel architecture for row-based field programmable gate arrays (FPGAs) and more particularly relates to the use of a simulated annealing based channel architecture synthesis algorithm which has been developed to achieve maximum routability and performance of a channel architecture for various FPGA designs.

2. Description of the Prior Art

Figure 1:
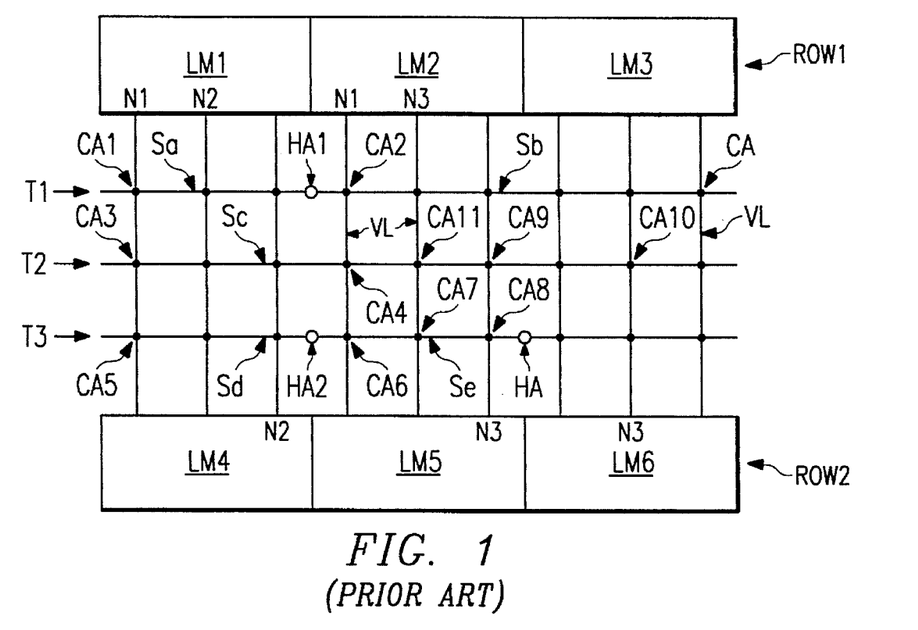
FIG. 1 is a standard configuration for a prior art row-based FPGA architecture.

Field Programmable Gate Arrays (FPGAs) combine the flexibility of mask programmable gate arrays with the convenience of field programmability. We consider row-based architecture for FPGAs as shown in FIG. 1. Rows of logic modules are separated by channels which are used for the routing of the nets. Only 2 rows (row1 and row2) of logic modules, with each row having three logic modules (LM1–LM6), are shown in FIG. 1. The two rows are shown separated by a single channel having three horizontal tracks T1–T3. However, typical FPGAs may have 20 rows of logic modules with 44 logic modules in each row. Each logic module can implement various types of logic functions and each logic module can be connected to any other logic module through pins on the logic modules as is well known. The routing resources are limited as there are a fixed number of horizontal routing tracks hardwired in each channel. The routing tracks are also segmented. For example, FIG. 1 has 3 tracks per channel of which the topmost track T1 is divided into two segments sa and sb separated by a horizontal antifuse HA1. In the unprogrammed state the antifuse HA1 offers a very high resistance, and hence, there is no electrical connection between the segments sa and sb. A low resistance electrical connection between the segments sa and sb can be established by programming the antifuse HA1. Dedicated vertical lines VA through each input and output pin of a logic module connect the pins to the routing tracks T1–T3. Vertical feedthroughs pass through the modules, serving as links between channels. There is a cross antifuse CA located at the crossing of each horizontal and vertical segment. Programming these antifuses produces a bi-directional connection between the horizontal and vertical segments. Let us again consider FIG. 1. The net names are shown at its constituent pins' locations. There are three available choices for routing net 1-segments sa and sb (requires programming of an antifuse HA1 between segments sa and sb, and two cross antifuses CA1 and CA2); segment sc (requires programming two cross antifuses CA3 and CA4); or segments sd and se (requires programming of a horizontal antifuse HA2 between segments sc and sd, and two cross antifuses CA5 and CA6). Once net 1 is assigned to one or more segments, those segment(s) are unavailable for further usage by any other net.

The routing resources are fixed, and hence, the channel segmentation scheme has an enormous effect on performance and routability of a channel. Efficient usage of horizontal antifuses is required for routability and for meeting the critical path delay (performance) requirements. Intuitively, a strong correlation between the segment length and the net length distributions within a channel is very desirable. However, the mere existence of a unique segment of acceptable length for every net in a channel does not guarantee 100% routability. This is due to the fact that an additional factor, the location of a segment with respect to a net span in a channel is also important in determining whether that segment can be used for routing that net. It is imperative, therefore, to consider the spatial distributions for segments and nets when developing a particular channel architecture. Once a channel architecture is developed for a particular FPGA net design, it may be desirable that the particular channel architecture also be useful for various other net designs. This is especially so, due to the reprogrammable nature of current FPGA's. Prior art FPGA channel architecture was developed with a sort of hit or miss approach with a desire toward selecting a random distribution of channel segmentation.

It is therefore a general object of the present invention to develope a channel segmentation architecture for row-based FPGA's which provides for good routability and performance over a large set of FPGA net designs.

It is further object of the present invention to develope a channel segmentation architecture for row-based FPGA's which maximizes the correlation between the spatial distribution of segments of the channel architecture and the nets over a large set of FPGA net designs.

It is a further object of the present invention to route the nets of a particular FPGA design with maximum performance and routability, once a particular channel segmentation architecture has been developed.

These and other objects of the invention will become apparent to those of ordinary skill in the art having reference to the following specification, in conjunction with the drawings.

SUMMARY OF THE INVENTION

A simulated annealing based channel architecture synthesis procedure has been developed, which attempts to maximize the correlation between the spatial distribution of segments and nets. A set of benchmark net distributions were obtained from Texas Instruments' gate array designs. The optimization procedure can be also used to produce channel architectures for net length distributions in functional forms.

The routability of a channel and the performance of the routed nets may have conflicting requirements.

For a given number of tracks, very short segments usually enhance routability at the expense of performance. For such a granular segmented channel architecture routing of long nets may require that several short segments be joined together by programming horizontal antifuses. Depending on the antifuse technology, the programmed antifuses can add considerably to the path delays. A simulated annealing based channel architecture synthesis algorithm has been developed which enhances routability and performance. The synthesis algorithm is based on the fact that a strong correlation between the spatial distribution of nets and segments in a channel improves both routability and performance. Excellent results have been obtained for a set of benchmark examples and industrial designs.

BRIEF DESCRIPTION OF THE DRAWINGS

FIGS. 3(a–c) illustrates successive steps in the architecture synthesis methodology of the preferred embodiment.

DESCRIPTION OF THE PREFERRED EMBODIMENT

The following description is organized as follows. Section 2 describes the basis of antifuse programming and then describes segmented channel routing based on constraints derived from antifuse programming. The channel segmentation scheme of the preferred embodiment is described in Section 3. Section 4 discusses experiments performed and gives the experimental results. Finally, the conclusions are given in Section 5.

2 Preliminaries and Definitions

Routability of FPGAs requires the presence of a large number of cross antifuses and horizontal antifuses in channel. An antifuse requires multiple programming pulses to successfully form an electrical connection between logic modules or segments. Depending on the circuit size and device types, 3,000 to 20,000 antifuses are topically programmed. Cross antifuse programming introduces certain routing constraints which influence channel architecture synthesis. The following section details the cross antifuse programming methodology.

2.1 Cross Antifuse Programming

Each cross antifuse in a channel can be individually addressed for programmation. Let us consider cross antifuse CA5 of FIG. 1. Programming cross antifuse CA5 requires charging the vertical line crossing this antifuse to a voltage VPP and the segment sd, crossing antifuse CA5 horizontally, to GND(0 V). Voltage VPP is determined by the antifuse technology under consideration. A voltage stress of VPP across the antifuse for a certain period of time creates a low resistance (technology dependent) connection between the vertical line and the horizontal segment. All other vertical and horizontal lines are charged to a voltage of VPP/2. It can be noted that the other unprogrammed cross antifuses experience a voltage stress of 0 volts or VPP/2 volts, and hence remain unprogrammed.

2.2 Channel Routing

The channel routing problem is formulated as an assignment problem where each net within a channel is assigned to one or more unassigned segments. Each net is allowed to use at most one track due to a technology constraint which does not allow programming of antifuses connected in an L-shaped fashion. For a discussion of this technology constraint see "An Architecture for Electrically Configurable GAte Array", IEEE Journal of Solid State Circuits, Vol. 24, No. 2, pp 394–398, April 1989, by A. E. Gammal et al. The programming of such antifuses can lead to programming two antifuses at the same time which can degrade the performance of the programmed antifuses. Let us consider net 3 (N3) of FIG. 1. If the net were routed by programming cross antifuses CA7, CA8, CA9, and CA10 (using 2 tracks) then cross antifuses CA7, CA8, and CA9 form an "L". After programming any two of the antifuses forming the "L", and while trying to program the third one using the technique described in Section 2.1, antifuse CA11 also gets programmed at the same time. The electrical connection due to the programming of antifuse CA11 does not logically affect routing. However, whenever two or more antifuses get programmed simultaneously using the same programming pulse, the reliability of the connections thus produced may not be very predictable.

The cost of routing is determined by the number of segments used by the critical nets (What do you mean by critical nets?) in a channel, and the length of the segments assigned to different nets. The number ($H_x$) of horizontal antifuses to be programmed is equal to the number of segments assigned to the corresponding net (x) minus one. Note that the number of cross antifuses (cfuses) is not considered during routing. Depending on the technology, the resistance and the capacitance associated with programmed horizontal antifuses (hfuses) can be detrimentally high. If a net x of Length $L_x$ is routed with $p (1 \leq p \leq K$, maximum of K segments allowed) segments, each of length $L_j$ (j=1, ... p), then $$\{(\Sigma_{j=1}^{p} L_j) - L_x\}$$

gives a measure of the wasted or excess segment(s) length. For K-segment routing, in which a maximum of K segments can be used by each net, we define the cost C of routing a net x as $$C_x = w_1 \cdot \alpha + w_2 \cdot \beta$$

where $$\alpha = \frac{\Sigma_{j=1}^{p} L_j - L_x}{\Sigma_{j=1}^{p} L_j}$$

$$\beta = \frac{H_x}{K+1}$$

where $\alpha$ and $\beta$ are penalties for segment length wastage and horizontal antifuse usage, respectively, and are both positive and less than 1. The weights $w_1$, $w_2$ assigned to the wastage factor, and the antifuse usage factor respectively, are determined by the technology under consideration. For example, the metal-metal horizontal antifuse as described in a paper titled "A Very High Speed Field Programmable Gate Array Using Metal to Metal Antifuse Programming Elements", IEEE Custom Integrated Circuits Conference, pp 1.7.1–1.7.6, May 1991 by J. Birkner et al., has a much lower programmed resistance than a programmed poly-poly antifuse, and hence, $w_2$ for the latter technology should be higher than the metal-metal antifuse technology. If you are using ONO anti-fuse technology then the resistance is approximately 400 ohms. In this case you don't want to use too many horizontal antifuses because of the high resistance. It was experimentally determined that a weight of 2 for $w_1$ and a wieght of 7 for $w_2$ give a good correlation between the segments and nets to be routed. A ratio of approximately 3 to 1 for $w_2/w_1$ is desireable for the weights. The total cost of routing all the nets in a channel is $\Sigma_p$, $C_p$, $0 < p \leq V$, where V is the total number of nets in a channel.

A paper by Green et. al. entitled "Segmented Channel Routing", Design Automation Conference, pp. 567–572, 1990, has shown that K-segment (K>1) channel routing problem is NP(non-deterministic polynomial)-complete. For K-segment routing each net is allowed a maximum of K adjacent segments (on the same track) for routing. However, for purposes of this invention, we use a fast 1-segment routing scheme which can be efficiently used to optimize the channel architecture. The nets are ordered in decreasing order of length while the segments are ordered in increasing order of length. The nets are assigned to the first available segment(s) in that order. Once a net is assigned to a segment, the corresponding segment is made unavailable for further routing of any other net. It can be observed that the first segment that can be assigned to the net is the best match in terms of segment length wastage. If there are m nets in a channel consisting of n track segments, then the worst case routing complexity is O(mn) with the above ordering scheme. It takes O(m log(m)) and O(n log(n)) time to sort the nets and the segments, respectively. Use of the 1-segment routing to determine a cost of routing a particular architecture will be further described in section 3.3 dealing with the synthesis technique of the preferred embodiment.

3 Channel Architecture Synthesis

Given a channel architecture, the routability and the performance are solely dependent on the net length distribution and the location of the nets across the channels. Hence, to come up with a good segmentation scheme we consider the net length and their spatial distributions across the channels for a wide range of gate-array examples. The distributions were obtained from a set of gate-array benchmark designs with a given channel length of 44 logic modules. Of course this invention is not limited to developing channel architectures for gate array designs having only 44 logic modules in a row.

3.1 Routability and Routing delay

It can be observed from FIG. 1 that if the routing tracks T1, T2, and T3 are finely segmented, routability is enhanced. However, for routing the longer or more critical nets, a larger number of horizontal antifuses will probably be required. The resistance and capacity of the programmed antifuses can be detrimentally high for some of the critical nets. If all the track segments are long, routability decreases because of the decrease in the number of available segments for routing. Hence, a judicious mixture of long and short segments are required to get the best performance routability from the architecture.

The net length distributions across a channel is given by the number ($n_j$) of nets of length ($l_j$) present in the given channel. Lengths are quantized to the logic module width (shown in FIG. 1), which is the minimum segment length in our case. Given a set of p net length distributions $D_i$, $0>i\leq p$, (each consisting of a set of nets $N_i$), the total length of nets for each distribution $D_i$ is given by $L_i = \Sigma_j n_j l_j$. Let the given channel have a set of segments S, where the total length of the segments is given by T. Lemma 1: The necessary condition for routing the sets of nets $N_i$ forming distribution $D_i$ is : $T \geq \max\{L_i, \forall i\}$. Proof: In order to route all the nets, the total segment length (T) within a channel (to which the nets are assigned) should be at least the total length ($L_i$) of the set of nets $N_i$, and hence the result. The area under the segment length distribution curve for a channel should be at least equal to the largest area under any one of the p net length distribution curve for the channel.

3.2 Net-Segment Correlation

For best performance and routability, the segment length distribution and the segments' spatial location within the channel should very closely follow the net length and their spatial distributions. We determine the correlation between the net and segment distributions within a channel in terms of 1-segment routing and the segment wastage factor as described in Section 2.

To solve the segmentation problem efficiently, the channel is divided into q equal zones by imaginary vertical lines, the minimum zone length being equal to the length of a logic module. Let us consider FIG. 2 as an example. There are 6 zones, $zone_1$ through $zone_6$ in the Figure. A minimum segment length of one logic module width is used in all discussions. The track segments are ordered in terms of increasing length. This is done so that the longest segments can be assigned to the shortest possible segments by going through the list of tracks.

Each segment s carries information on its spatial location within the channel—the left most ($s_l$) and the right most ($s_r$) zones that the segment spans across. For example, for segment c in FIG. 2, $c_1=1$ and $c_r=3$, whereas, for segment f, $fl=1$ and $fr=1$. A channel is divided into M zones, where M is the number of logic modules per row of channel. A net n $\in N_i$ whose left most and right most zones are given by $n_l$ and $n_r$ is 1-segment routable if there exists an unassigned segment $g \in S_a$, (the set of available segments) such that $$g_l \leq n_l \text{ and } g_r \geq n_r \quad (1)$$

The set of unavailable segments (already assigned to some nets) is given by $S_u=(S-S_a)$, where S is the total of all available and unavailable segments. Once such an assignment is made, segment g is made unavailable for the routing of any other net. If it is possible to find such assignments for all the nets in a channel, the set of nets are said to be 1-segment routable with respect to that segmentation scheme. Let us consider net 1 of FIG. 1, where M=6, $net1_l=1$ and $net1_r=3$. To start with, all the segments in the channel belong to set $S_a$, and $S_u$ is empty. Condition (1) is satisfied for net 1 with respect to segment c. As $c \in S_a$, net 1 can be assigned to segment c, and hence is 1-segment routable. Segment c is made unavailable for any other net by moving segment c from set $S_a$ to set $S_u$ ($c \notin S_a$, $c \in S_u$). However, there are no segments in set $S_a$ which satisfies condition (1) for net 2 after net 1 is routed with segment c, making net 2 unroutable if net 2 were routed first using segment c.

The nets are ordered in terms of decreasing length and the longest net is routed first. The segments within a channel are ordered in terms of increasing length. The list of ordered segments are searched to assign a net to a proper segment. The search can stop as soon as a possible assignment is obtained, which satisfies condition (1). If net n is assigned to segment g then the segment wastage factor is given by $$\alpha_n = \frac{(g_r - g_1) - (n_r - n_1)}{(g_r - g_1)}$$

(gr–gl) and (nr–nl) respectively denote segment length and net length in terms of the number of zones they span across. Routing produces a set of 1-segment routable nets $N_{ir}$ and a set of 1-segment unroutable nets $N_{iu}$. For 1-segment routable channels, $N_{iu}$ is empty. However the given set of nets $N_i$ are possible K-segment routing, the set of 1-segment unroutable net $N_{iu}$ (after initial 1-segment routing) and the given channel are considered. Obviously, condition (1) cannot be satisfied for any net $n \in N_{iu}$ with any segment $g \in S_a$. The maximum x-coordinate overlap, $\theta_{ng}$ of a net $n \in N_{iu}$ with any segment $g \in S_a$, can be used as a heuristic measure of K-segment routability of net n. The larger the value of $\theta_{ng}$, the larger is the measure of K-segment routability. Segment g is moved from set $S_a$ to the $S_u$ after such an overlap is established. Let us again consider the nets and the channel of FIG. 2. After routing net 1, net 2 is not 1-segment routable, and hence is a member of set $N_{iu}$. However, net 2 has a large overlap ($\theta_{2a}=2$, where 2 zones is the length of the overlap between segment a and net 2) with unassigned segment a. Though condition (a) is not satisfied with respect to segment a, net 2 can be routed using 2 segments—a and b.

It can be observed that exact K-segment routability could have been used as a measure of correlation between S and $N_i$. However, that would be very CPU time intensive. We obtained good results using 1-segment routability and segment wastage as the measure of correlation.

3.3 Synthesis Technique

Figure 2:
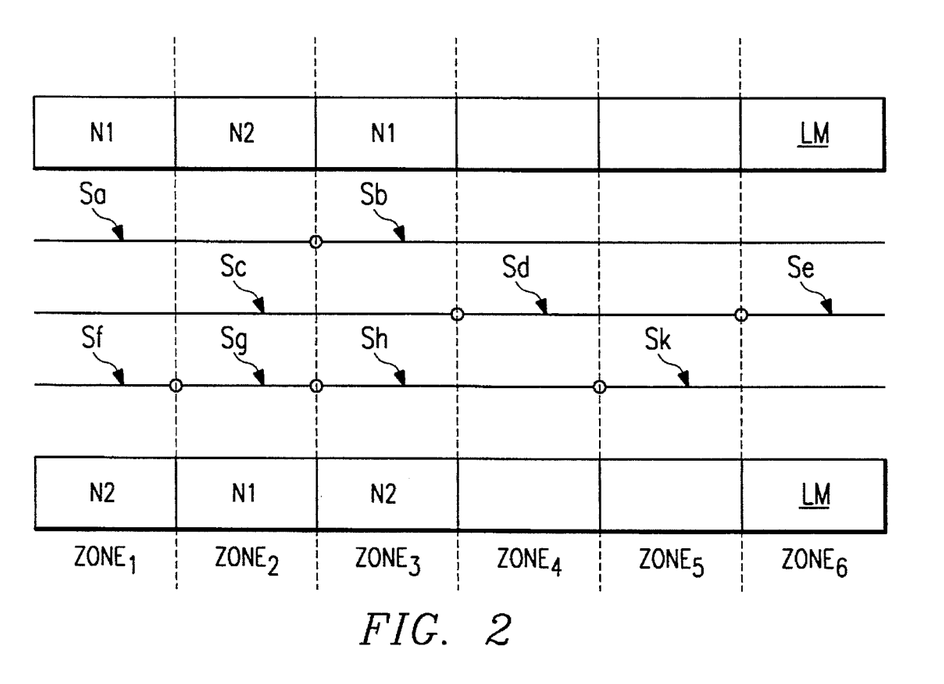
FIG. 2 is an illustration of the division of a row-based FPGA architecture separated into 6 zones, wherein each zone is one logic module in width.

A simulated annealing based channel segmentation synthesis methodology has been developed which tries to optimize the horizontal antifuse usage and segment wastage for different net distributions. This technique is discussed in a paper entitled "Optimization by Simulated Annealing", Science, Vol. 220, N. 4598, pp. 671–680, May, 1983 by S. Kirkpatrick et al. The current invention uses net distributions from a large set of gate array benchmark designs to optimize our channel segmentation architecture. The routing cost for channel i, having the set of nets $N_1$, and a set S of already laid out segments is given by $$C_i = v_r \cdot |N_{iu}| + v_w \cdot \alpha_i + v_o \cdot \sum_{k \in N_{iu}} \frac{\theta_{jg}}{k_r - k_1}$$

where, $|N_{iu}|$ represents the cardinality of set $N_{iu}$ and is equal to the number of unroutable nets in channel i. The first term in the equation corresponds to the number of 1-segment unroutable nets, the next term is due to the segment wastage factor, while the last term corresponds to percentage segment overlap for the unroutable nets. Let us again consider FIG. 2. For the 1-segment unroutable net N2, the percentage segment overlap with an unassigned segment a is $\frac{2}{3}(\theta_{2a}=2$ and $(net2_r-net2_l)=3)$ while the percentage segment overlap with segment sf is $\frac{1}{3}(\theta_{2f}=1$ and $(net2_r-net2_1)=3$. $v_r$, $v_w$, and $v_o$ are the weights associated with the corresponding factors. The routability weight $v_r$ is much higher than $v_w$ or $v_o$ as it relates to both routability and performance. The 1-segment routable nets with low segment for routing due to the presence of programmed horizontal antifuse(s). The weight $v_o$ associated with the overlap factor is a small negative number. For unroutable nets we consider a larger overlap to be better— the net has a higher probability of getting routed using two or more segments. It was experimentally determined that the weight $v_r$ is approximately 100–200, the weight $v_w$ is approximately 5–10 and the weight $v_o$ is approximately $-(1-2)$. For p different channels (p sets of nets, $N_i, N_2, \ldots N_p$), the total cost of routing, C, using the same set of segments S is given by $$C = \Sigma_{i=1}^{p} C_i.$$

The usage of 1-segment routability and the overlap factor represents a novel way of efficiently determining the K-segment routability of a segmented channel architecture.

Due to the complex nature of the cost function, simulated annealing was used. Annealing starts by assigning an arbitrary segmentation for a channel of given width and a given number of tracks. Care should be taken to ensure that the segments exactly fit each track and there are no empty spaces on the tracks. Either one of two moves is allowed in annealing—merging of two adjacent segments in a track or breaking of a segment within a track into two segments such that the broken segments add up to the original segment length. The segments are randomly picked for either merging or breaking. Merges or breaks are also determined randomly. It is not possible to break a segment of length equal to the width of a single logic module. After each move the cost $C_i$ is calculated for each of the sets of net distributions, $N_i, \ldots N_p$. If C is accepted with a probability $$\frac{-|\delta(C)|}{e^{Temp}},$$

where $|\delta(C)|$ is the absolute value of the change in cost C and Temp is the annealing temperature. At a higher temperature a higher cost move is accepted with a higher probability than at a lower temperature. This helps the optimization technique to move out of local minimas of the cost function. The cooling schedule used is the same as the one proposed in a paper titled "An Efficient General Cooling Schedule for Simulated Annealing", Intl. Conf. on Computer-Aided Design, pp. 381–384, 1986, by M. Huang et al.

Figure 3A:
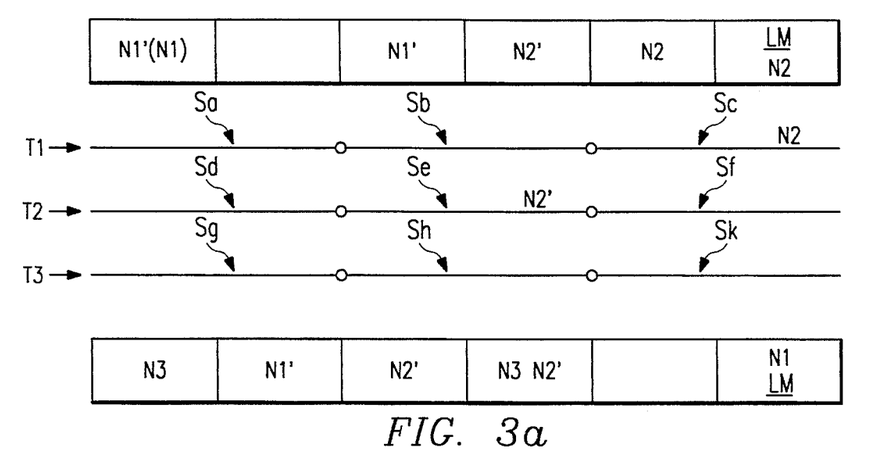

Let us consider a simple example to illustrate the architecture synthesis methodology. FIG. 3(a) shows an initial channel segmentation. There are three routing tracks T1, T2, and T3 having uniform segmentation, each segment having a length of two logic modules. The channel is divided into six equal zones. Two net distributions, N (only two nets) and N' (only three nets) are also shown in the figure. The pin numbers with primes correspond to the distribution belonging to N'. It can be observed that for such a segmentation, net 2 of distribution N can be assigned to segment sc (or sf, or sk having same cost), while net 2' of distribution N' can be assigned to segment se (or sb, or sh having same cost). However, all the other nets are not 1-segment routable. If we assume that $v_w=100$, $v_w=2$, and $v_o=0$, then the cost of routing using Eqn (2) and (3) is given by:

$$C_N=100*2+2*0=200$$

$$C_{N'}=100*1+2*0=100$$

Hence, the total cost after the first iteration is $$C_1=C_N+C_{N'}=300$$

Figure 3B:
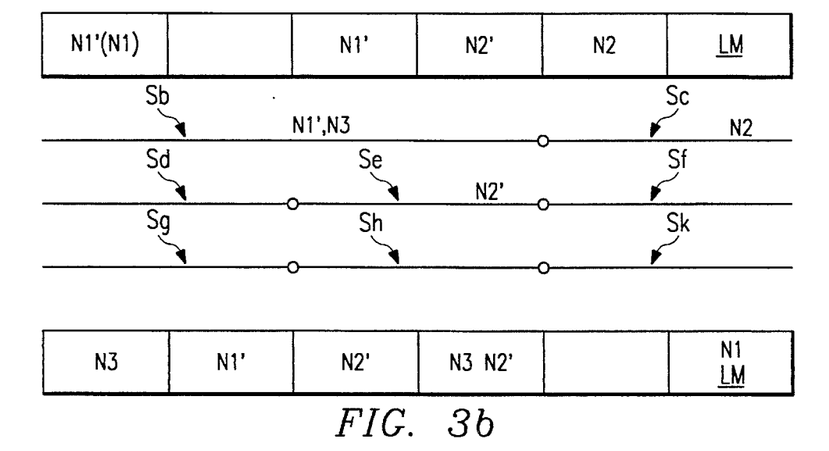

Now the algorithm can randomly pick a segment (say sb) and merge it with segment sa (FIG. 3(b)). For such a move, the change in cost is calculated. Net 1' can now be assigned to segment sb, and net 2' to segment se, making distribution N' 1-segment routable. For distribution N, net 2 and 3 are assigned to segments sc and sb respectively. Note that net 1' is also assigned to segment sb. That is allowed because the nets belong to different distributions, i.e. the distributions N and N' do not share the segmentation at the same time. The portion of segment wasted when net 1' of length 3 zones is assigned to segment sb of length 4 zones is $$\frac{4-3}{4} = 0.25.$$

It can be observed that for all the other routed nets, the segment wastage factor is 0 (this of course does not include the wastage due to segment quantization). The nets assigned to the segments are also shown in the Figure on the top of each segment. Net 1 of distribution N is 1-segment unroutable. Hence, the new cost of routing is given by:

$$C_N = 100 * 1 + 2 * 0 = 100$$

$$C_{N'} = 100 * 0 + 2\frac{4-3}{4} = 0.5$$

The total cost after the second iteration is $$C_2=C_N+C_{N'}=100.5$$

Figure 3C:
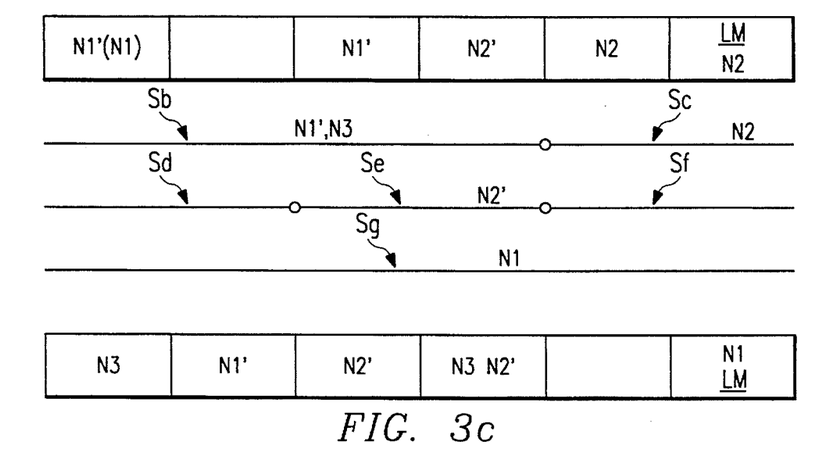

The change of cost (delta C)=$C_1-C_2$=199.5, and hence the move of merging sb and sa together is accepted. After a few iterations, the synthesis algorithm came up with an architecture shown in FIG. 3(c), which indeed produces the lowest cost of routing:

$$C_N = 100 * 0 + 2 * 0 = 0$$

$$C_{N'} = 100 * 0 + 2^{\frac{4-3}{4}} = 0.5$$

and hence, $$C = C_N + C_{N'} = 0.5$$

In general, it can take several iterations—in the thousands—to arrive at a minimum cost. The idea is to come up with a cost which is some acceptable minimum. However, this cost is not known at the start of the algorithm.

4 Implementation and Results

The synthesis procedure based on simulated annealing has been implemented in C on an Apollo 425 workstation. The set of net distributions in different channels for our experiments were obtained from a set of gate array benchmark designs of Texas Instruments. Uniform segmentation was used as an initial state for simulated annealing where each segment was of length 2 logic modules. For all our experiments a track length of 44 logic modules have been used. Hence, there were 44 zones. The channel architecture obtained using our synthesis procedure was compared with existing industrial segmentation schemes having 12 or 22 tracks. The FPGA template (only the number of rows) were varied to fit different designs. Each of the channels had identical segmentation. The segmentations were also compared with a uniform channel segmentation scheme with 2 logic module long segments. The latter channel architecture is very good for routability. However, routing requires programming a large number of horizontal antifuses which degrades performance.

A segmented channel router [6] developed at Texas Instruments was used for evaluating the segmented channel architectures. The channel router uses the cost $C_x$ described in equation 2 to assign a set of nets to one or more segments (K-segment routing). Weights of $w_1=1$ and $w_2=20$ were used. Therefore, there was a heavy penalty placed on the usage of antifuses.

Table 1 shows the details of the results obtained for an industry design example f104667. The first two columns show the channel number and the number of nets in each channel. The number of horizontal antifuses programmed, the number of unroutable nets in each channel, and the percentage segment wastage for our Simulated Annealing based Segmentation (SAS) scheme are compared with an existing industrial segmentation scheme (I) with 12 tracks. The results were also compared with a uniform segmentation scheme (U) having each segment of length two logic modules. Five of the nine channels were not routable with architecture I. Architecture I is the TPC1010 architecture of Texas Instruments. The SAS scheme completely routed all the channels and used lesser number of horizontal antifuses. Uniform segmentation used lot of horizontal

TABLE 1

Results for f104667 with 12 tracks

| chan-nel | nets | Hfuses | | | Unrouted nets | | | Seg. wastage (%) | | |
|---|---|---|---|---|---|---|---|---|---|---|
| | | SAS | I | U | SAS | I | U | SAS | I | U |
| 1 | 23 | 0 | 0 | 29 | 0 | 0 | 0 | 56.1 | 54.2 | 33.0 |
| 2 | 31 | 0 | 1 | 57 | 0 | 1 | 0 | 55.3 | — | 28.9 |
| 3 | 50 | 1 | 0 | 78 | 0 | 2 | 0 | 54.6 | — | 31.9 |
| 4 | 55 | 0 | 5 | 74 | 0 | 6 | 0 | 55.0 | — | 31.5 |
| 5 | 66 | 0 | 2 | 75 | 0 | 11 | 0 | 61.5 | — | 34.7 |
| 6 | 61 | 0 | 1 | 55 | 0 | 9 | 0 | 67.8 | — | 36.4 |
| 7 | 40 | 0 | 0 | 64 | 0 | 0 | 0 | 55.4 | 64.6 | 30.4 |
| 8 | 40 | 0 | 0 | 47 | 0 | 0 | 0 | 62.0 | 71.7 | 34.4 |
| 9 | 19 | 0 | 0 | 24 | 0 | 0 | 0 | 57.1 | 56.0 | 38.1 | antifuses due to its granular segmentation architecture. However, as expected, segment wastage was considerably lower for the U scheme than the other two architectures. Percentage segment wastage in the last column was calculated using actual net and segment lengths. A '-' appears in the percentage segment wastage column whenever there were unroutable nets in a channel.

Table 2 summarizes the statistics of some other examples and shows the routing results on a channel with uniform segmentation (U), each segment having a length of 2 logic modules. This table can be used for comparing the results obtained using SAS. Twentytwo routing tracks were used. The total number of channels for each example and the total number of nets in all the channels are shown in columns 2 and 3, respectively. The average net density over all the channels is shown next. Net density of a channel is defined as the maximum number of nets crossing any imaginary vertical line through the channel and is a measure of the number of tracks required for unsegmented routing as in gate arrays. A large number of antifuses wee used because of the very granular segmented channel. Percentage segment wastage in the last column represents the average over all the channels for the example under consideration and can be compared to Table 3 shown below. Again due to the fine granularity of the architecture, segment wastage is low. Such an architecture is good for routability, and hence, there were no unroutable nets. It must be noted that the number of hfuses used and the percentage segment wastage are excellent measures for both performance and routability.

TABLE 2

Results of routing on channels having uniform segmentation, each segment of length 2 logic module width

| Example | Number of channels | Total number nets | Average net density | Hfuses | Seg. wastage (%) |
|---|---|---|---|---|---|
| f104780 | 19 | 1074 | 12.1 | 2713 | 31.8 |
| f104243 | 14 | 770 | 9.3 | 1452 | 32.4 |

TABLE 2-continued

Results of routing on channels having uniform segmentation, each segment of length 2 logic module width

| Example | Number of channels | Total number nets | Average net density | Hfuses | Seg. wastage (%) |
|---|---|---|---|---|---|
| cf92382a | 19 | 1174 | 8.7 | 1656 | 39.44 |
| f103918 | 19 | 1136 | 11.3 | 2540 | 28.4 |
| duke2 | 8 | 496 | 13.9 | 1408 | 26.7 |
| bw3 | 8 | 317 | 6.9 | 406 | 27.9 |

TABLE 3

Results of routing on SAS architecture

| Example | Hfuses SAS | Hfuses I | Unrouted nets SAS | Unrouted nets I | Seg. wastage (%) SAS | Seg. wastage (%) I |
|---|---|---|---|---|---|---|
| f104780 | 44 | 56 | 0 | 6 | 44.5 | 45.9 |
| f104243 | 0 | 1 | 0 | 0 | 44.0 | 44.8 |
| cf92382a | 0 | 0 | 0 | 0 | 48.9 | 52.0 |
| f103918 | 15 | 20 | 0 | 0 | 43.3 | 43.5 |
| duke2 | 11 | 12 | 0 | 0 | 43.2 | 44.9 |
| bw3 | 36 | 44 | 0 | 13 | 52.0 | 45.6 |

Table 3 summarizes the results of routing on the SAS architecture of the preferred embodiment using the industrial and MCNC benchmark designs of Table 2. Twentytwo routing tracks were used. The results were compared with architecture I. Architecture SAS produced better results in terms of channel routability and percentage segment wastage. For example bw3, there were 13 unroutable nets. However, architecture SAS could route all the nets. The unroutable channels were not considered in segment wastage calculation. The lower percentage segment wastage for I for example bw3 may be attributed to the unroutable nets. For smaller examples both architectures produced comparable results.

Figure 4:
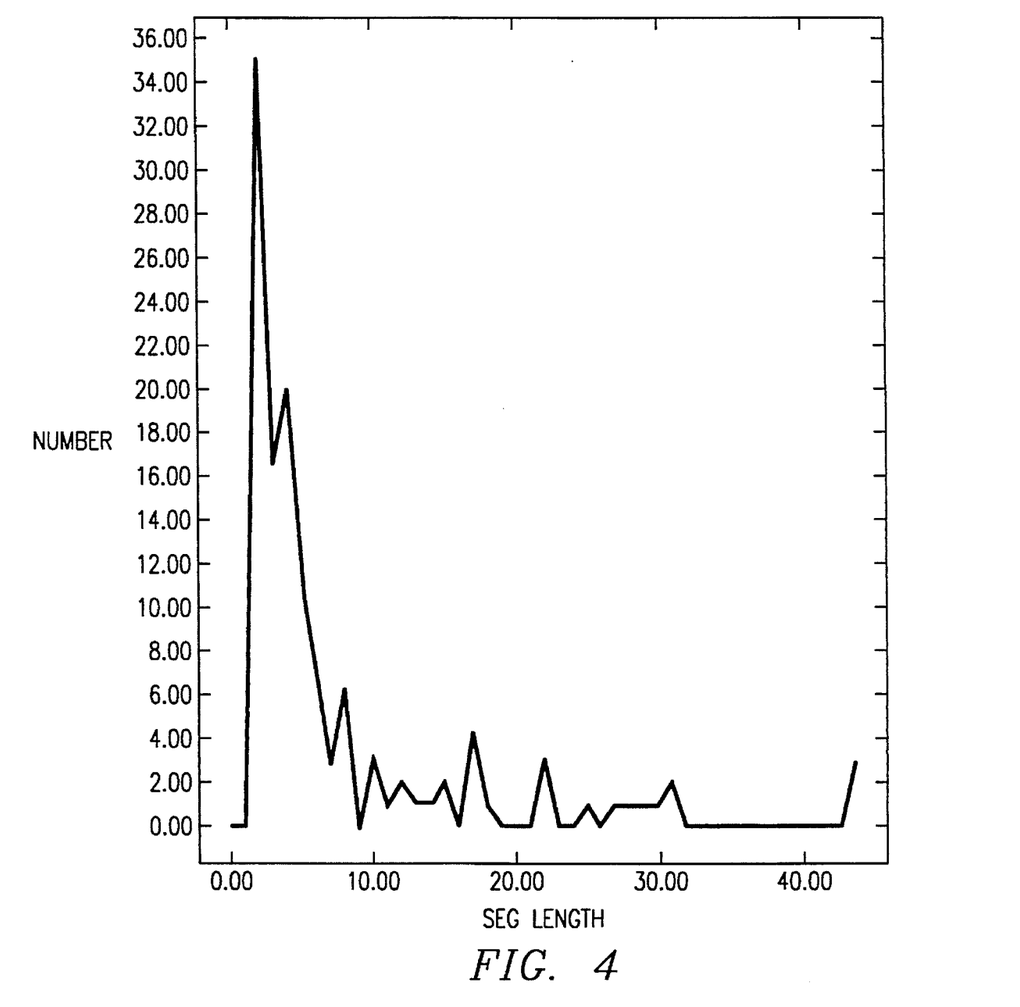
FIG. 4 illustrates the segment length distribution for the Simulated Annealing based Segmentation (SAS) scheme of the preferred embodiment.

FIG. 4 shows the statistics of SAS architecture. The x-axis represents the segment length in units of logic module width and the y-axis represents the number of segments of any particular length present in the channel. The synthesis program to generate this channel architecture with 22 tracks took about 7 hours of CPU time on an Apollo 425 workstation.

It should be noted that architectures are generated once, and hence, a large CPU time can be justified. The segment length distribution closely follows the benchmark net length distributions used to generate the channel. There are a number of small segments and a few large segments distributed across the channel of length 44 logic modules wide.

5 Conclusions

A routability and performance driven channel segmentation synthesis scheme for FPGAs has been proposed. The segmentation scheme is based on a large set of net distributions from a set of gate array benchmark designs with fixed channel length. The performance and routability of a channel are heavily dependent on the segmentation scheme and the distribution of nets within the channel. The correlation between the set of nets and the segments is determined using 1-segment routing, percentage of segment wastage, and the overlap factor—a higher correlation corresponds to a lower number of unroutable nets and lower segment wastage. Excellent results have been obtained for a set of benchmark examples and industrial designs. Our scheme can be easily extended at the expense of more computer time to include exact K-segment routing cost for simulated annealing. Though simulated annealing is computation intensive, it can certainly be used for architecture development. Architectures have to be optimized only once, and hence, we can afford to spend more computer time.

While the invention has been shown and described with respect to particular embodiments, it will be understood by those skilled in the art that the foregoing and other changes in form and detail may be made therein without departing from the spirit and scope of the invention.

We claim:

1. A method of segmenting a field programmable gate array (FPGA) channel architecture comprising:

(a) designing an initial channel architecture for a row-based FPGA having a preselected number of horizontal tracks in each channel and a preselected number of logic elements in each row, including assigning an arbitrary channel segmentation for the channel, wherein any single segment is no less than the width of one logic module, and wherein the same segmentation is used for each channel in the FPGA;

(b) modifying the assigned arbitrary channel segmentation by either merging two adjacent segments in a track or breaking a segment within a track into two segments, wherein the segments are randomly selected for either merging or breaking;

(c) determining the routing cost associated with different preselected net distributions with the assigned channel segmentation as follows:

$$C_i = v_r \cdot |N_{iu}| + v_w \cdot \alpha_i + v_o \cdot \sum_{k \in N_{iu}} \frac{\theta_{jg}}{k_r - k_l}$$

where the first term $V_r \cdot |N_{iu}|$ represents the number of 1-segment unroutable nets, the second term $V_{w \cdot \alpha i}$ represents the segment wastage factor, and the last term $$v_o \cdot \sum_{k \in N_{iu}} \frac{\theta_{jg}}{k_r - k_l}$$

represents the percentage segment overlap for the unroutable nets;

(d) repeat step (c) for each of the channels in the FPGA and add the cost of routing each channel to calculate a total cost C;

(e) repeating step (b) by again modifying the channel architecture;

(f) again repeating the step of determining the routing cost according to the formula in step (c) and (d) associated with different pre-selected net distributions with the modified channel segmentation;

(g) if the total routing cost is lower after modifying the channel architecture then this modification is accepted and if the total routing cost after modifying the channel architecture is higher then this modification is accepted only with a probability $e^{-|\delta(c)|/Temp}$ where $|\delta(c)|$ is the absolute value of the change in cost C and Temp is the annealing temperature, otherwise the modification is rejected and a further modification is made; and (f) repeating the steps of modifying the channel architecture and calculating the cost of routing until a certain minimal cost is achieved.

* * * * *